United States Patent [19]
Nakano et al.

[11] Patent Number: 6,023,195
[45] Date of Patent: Feb. 8, 2000

[54] ON-CHIP SOURCE FOLLOWER AMPLIFIER

[75] Inventors: Takashi Nakano; Nobuhiko Mutoh, both of Tokyo, Japan

[73] Assignee: NEC Corporation, Tokyo, Japan

[21] Appl. No.: 09/144,343

[22] Filed: Aug. 31, 1998

[30] Foreign Application Priority Data

Sep. 1, 1997 [JP] Japan ..................................... 9-236128

[51] Int. Cl.[7] ...................................................... H03F 3/16
[52] U.S. Cl. ............................................ 330/277; 330/307
[58] Field of Search ...................................... 330/277, 307, 330/308, 310, 311

[56] References Cited

U.S. PATENT DOCUMENTS

| | | | |
|---|---|---|---|
| 5,192,920 | 3/1993 | Nelson et al. | 330/307 X |
| 5,399,989 | 3/1995 | Chern | 330/277 X |
| 5,654,673 | 8/1997 | Shinohara | 330/277 X |

FOREIGN PATENT DOCUMENTS

| | | |
|---|---|---|
| 60-79822 | 5/1985 | Japan . |
| 60-223161 | 11/1985 | Japan . |
| 61-181207 | 8/1986 | Japan . |
| 2-262344 | 10/1990 | Japan . |
| 3-80706 | 4/1991 | Japan . |
| 6-153096 | 5/1994 | Japan . |

*Primary Examiner*—Steven J. Mottola
*Attorney, Agent, or Firm*—Young & Thompson

[57] ABSTRACT

In an on-chip source follower amplifier having at least one amplification circuit formed on a semiconductor substrate of a first conductivity type, the amplification circuit includes a driver transistor, a peripheral device, a first capacitance, and a high resistance. The driver transistor is formed in a first conductive region of a second conductivity type on the semiconductor substrate. The peripheral device is formed in a second conductive region of the second conductivity type on the semiconductor substrate. The second conductive region is isolated from the first conductive region. The first capacitance couples the first conductive region to a source of the driver transistor. The high resistance is connected between the first conductive region and a DC power supply.

10 Claims, 7 Drawing Sheets

ON-CHIP SOURCE FOLLOWER AMPLIFIER

BACKGROUND OF THE INVENTION

The present invention relates to an on-chip source follower amplifier for a solid-state image sensing device output portion.

Figure 8:
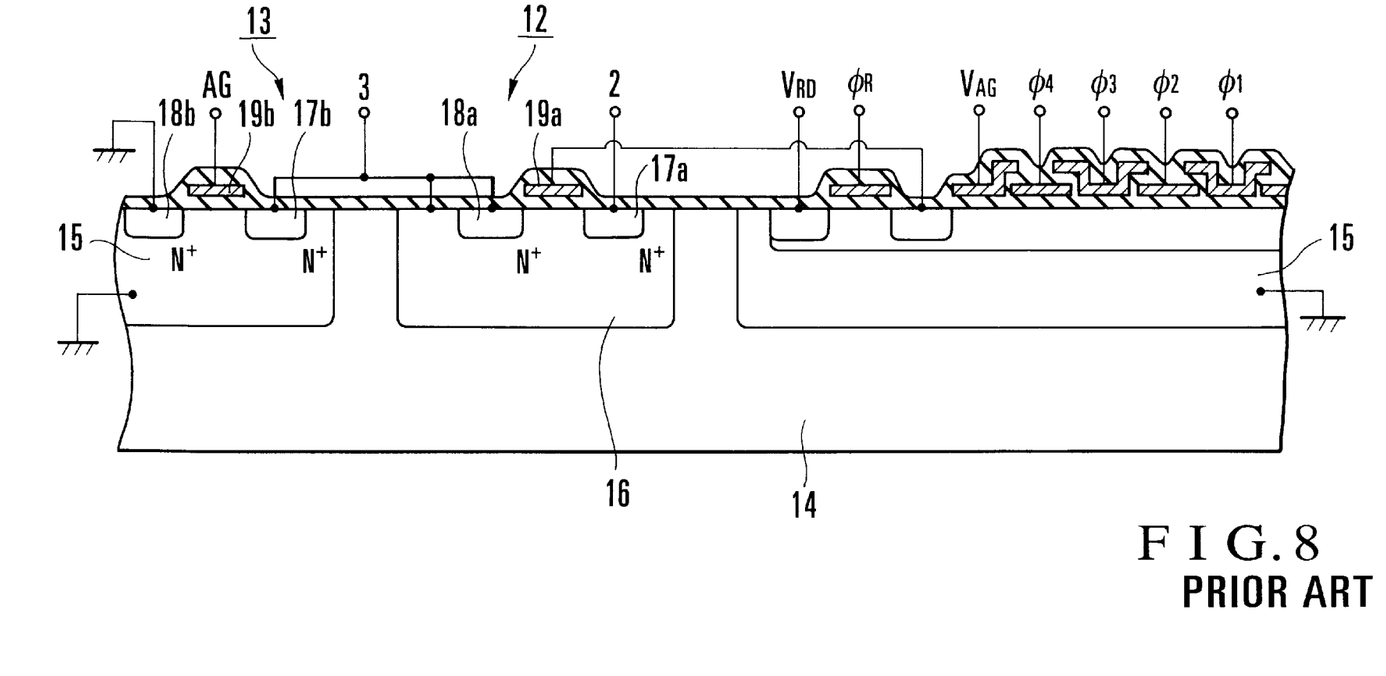
FIG. 8 is a longitudinal sectional view of the follower amplifier shown in FIG. 7.

In a conventional on-chip source follower amplifier for a solid-state image sensing device output portion, an increase in gain is realized by a technique disclosed in Japanese Patent Laid-Open No 60-223161. FIG. 8 shows the structure of the on-chip source follower amplifier for a solid-state image sensing device, which is disclosed in Japanese Patent Laid-Open No 60-223161.

Referring to FIG. 8, on the surface of a semiconductor substrate 14 having one conductivity type, conductive regions 15 having a conductivity type opposite to that of the semiconductor substrate 14 and an opposite conductivity-type conductive region 16 independently of the opposite conductivity-type conductive region 15 are formed. A driver transistor 12 is formed in the opposite conductivity-type conductive region 16. Devices including a load transistor 13 other than the driver transistor 12 are formed in the opposite conductivity-type conductive regions 15.

The driver transistor 12 has a drain 17a and a source 18a, which are separately formed on the surface of the opposite conductivity-type conductive region 16, and a gate 19a formed on the opposite conductivity-type conductive region 16 between the drain 17a and the source 18a via a gate insulating film. The load transistor 13 has a drain 17a and a source 18b, which are separately formed on the surface of the opposite conductivity-type conductive region 15, and a gate 19b formed on the opposite conductivity-type conductive region 15 between the drain 17b and the source 18b via the gate insulating film.

Figure 7:
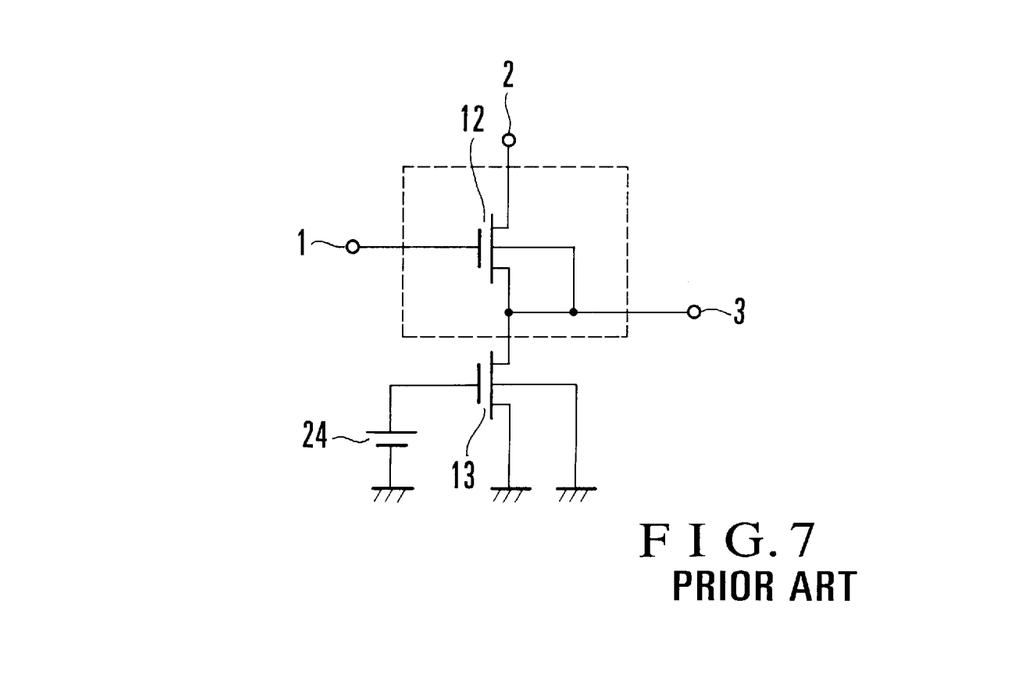
FIG. 7 is a circuit diagram of a conventional on-chip source follower amplifier for a solid-state image sensing device.

FIG. 7 shows an equivalent circuit of the solid-state image sensing device output portion shown in FIG. 8. Referring to FIG. 7, the gate of the driver transistor 12 is connected to an input terminal 1, the drain is connected to a power supply terminal 2, and the source is connected to an output terminal 3. The gate of the load transistor 13 is connected to a bias power supply 24, the drain is connected to the source of the driver transistor 12, and the source is grounded.

In this arrangement, letting gm be the transconductance of the driver transistor 12, gmb be the conductance of the opposite conductivity-type conductive region (to be referred to as a back gate hereinafter) 16, gds1 be the output conductance of the driver transistor 12, and gds2 be the output conductance of the load transistor 13, a gain G of the source follower amplifier is given by:

$$G = gm/(gm+gmb+gds1+gds2) \quad (1)$$

For this reason, when the back gate 16 is connected to the source 18a of the driver transistor 12, as in the prior art, gmb=0, and the gain G can be increased.

In the solid-state image sensing device, generally, the semiconductor substrate 14 is of an n type, and the opposite conductivity-type conductive regions 15 and 16 are of a p type. The power supply voltage 2 of the source follower amplifier, which is supplied to the power supply terminal 2, is 15 V. Conventionally, a voltage of about 15 V is applied to the semiconductor substrate 14. In fact, however, a voltage of about 5 V is applied along with the decrease in voltage. The opposite conductivity-type conductive region 15 is set at 0 V. The opposite conductivity-type conductive region 16 is set at about 8 V because it is connected to the source 18a of the driver transistor.

No problems are posed when the voltage of the semiconductor substrate 14 is 15 V, as in the prior art. However, when the voltage lowers to about 5 V, the p-type opposite conductivity-type conductive region 16 and the n-type semiconductor substrate 14 are forward-biased, so the function of the device is lost.

SUMMARY OF THE INVENTION

It is an object of the present invention to provide a solid-state image sensing device having an on-chip source follower amplifier capable of obtaining a high gain even when the semiconductor substrate voltage lowers to about 5 V along with the decrease in voltage.

In order to achieve the above object, according to the present invention, there is provided an on-chip source follower amplifier having at least one amplification circuit formed on a semiconductor substrate of a first conductivity type, the amplification circuit comprising a driver transistor formed in a first conductive region of a second conductivity type on the semiconductor substrate, a peripheral device formed in a second conductive region of the second conductivity type on the semiconductor substrate, the second conductive region being isolated from the first conductive region a first capacitance for coupling the first conductive region to a source of the driver transistor, and a high resistance connected between the first conductive region and a DC power supply.

DESCRIPTION OF THE PREFERRED EMBODIMENTS

The present invention will be described below with reference to the accompanying drawings.

Figure 1:
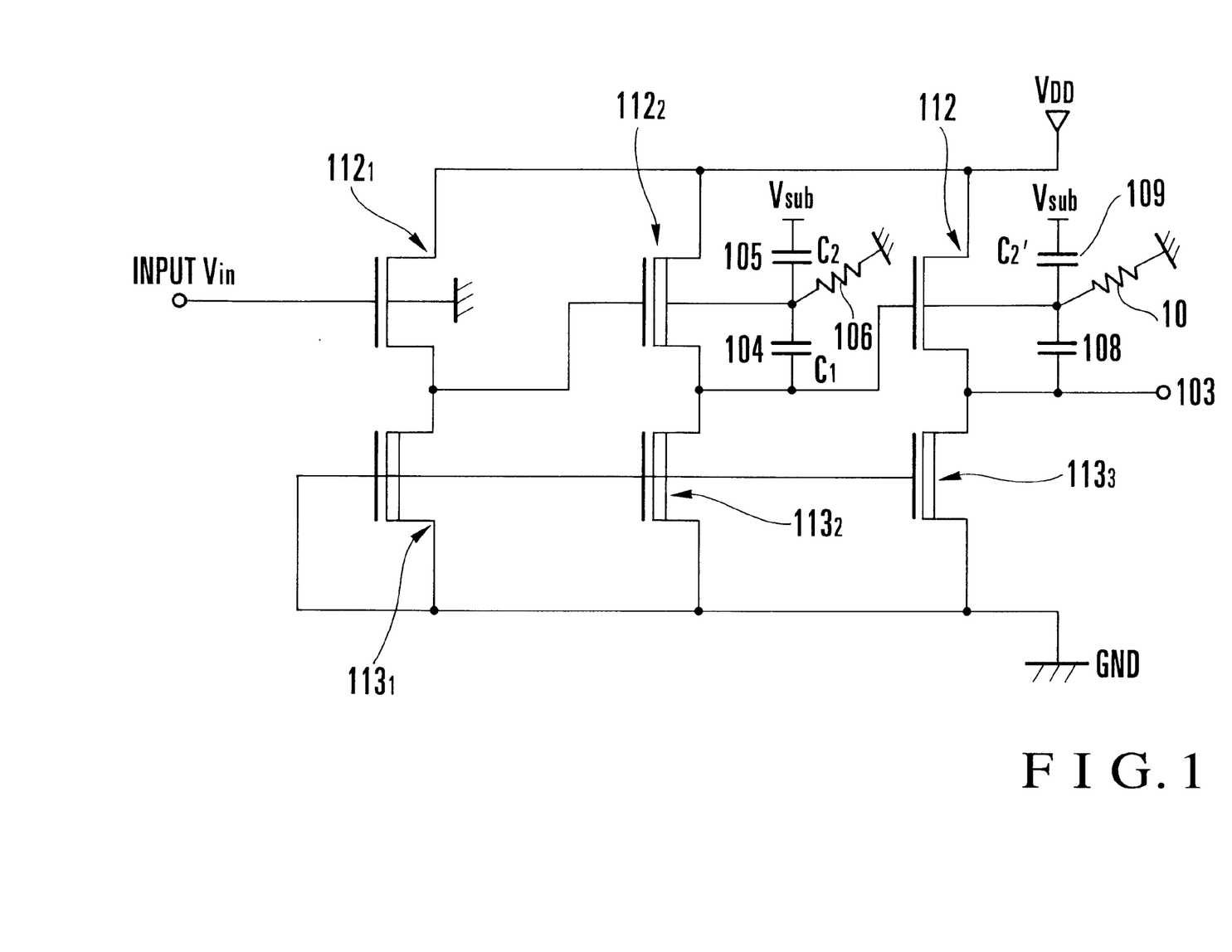
FIG. 1 is a circuit diagram of an on-chip source follower amplifier for a solid-state image sensing device according to the first embodiment of the present invention.

FIG. 1 shows an on-chip three-stage source follower amplifier for a solid-state image sensing device according to the first embodiment of the present invention.

Referring to FIG. 1, the three-stage source follower amplifier is constituted by six n-channel transistors $112_1$, $112_2$, $112_3$, $113_1$, $113_2$, and $113_3$. The transistors $112_1$, $112_2$, and $112_3$ at the upper stage are called driver transistors, and the transistors $113_1$, $113_2$, and $113_3$ at the lower stage are called load transistors. The drains of the three driver transistors $112_1$, $112_2$, and $112_3$ are commonly connected to a power supply voltage VDD, and the sources of the three load transistors $113_1$, $113_2$, and $113_3$ are commonly connected to GND (ground).

The sources of the driver transistors $112_1$, $112_2$, and $112_3$ are connected to the drains of the load transistors $113_1$, $113_2$, and $113_3$, respectively. The connection point between the first driver transistor $112_1$ and the first load transistor $113_1$ is connected to the gate of the second driver transistor $112_2$.

The connection point between the second driver transistor $112_2$ and the second load transistor $113_2$ is connected to the gate of the third driver transistor $112_3$. The connection point between the third driver transistor $112_3$ and the third load transistor $113_3$ at the last stage is connected to an output terminal 103 connected to an external circuit. The gate of the driver transistor $112_1$ is connected to an input terminal 101 to which an input signal Vin is supplied.

The back gates of the driver transistors $112_2$ and $112_3$ are connected to the semiconductor substrate through capacitances 105 and 109, respectively, and applied with a semiconductor substrate potential Vsub. These back gates are connected to the sources through capacitances 104 and 108 sufficiently larger than the capacitances 105 and 109. In addition, a desired DC voltage is applied to the back gates through high resistances 106 and 110, respectively.

The values of the capacitances 104 and 108 and high resistances 106 and 110 between the sources and the back gates are determined such that the cutoff frequency of a high-pass filter constituted by the capacitances 104 and 108 and high resistances 106 and 110 between the sources and the back gates becomes sufficiently smaller than the signal frequency transmitted from the sources. The capacitance 104 or 108 between the source and the back gate is set to be sufficiently larger than the capacitance 105 or 109 between the back gate and the semiconductor substrate. The gates of the load transistors $113_1$, $113_2$, and $113_3$ are biased (grounded in FIG. 1) to obtain a desired current as a constant current source.

Figure 2:
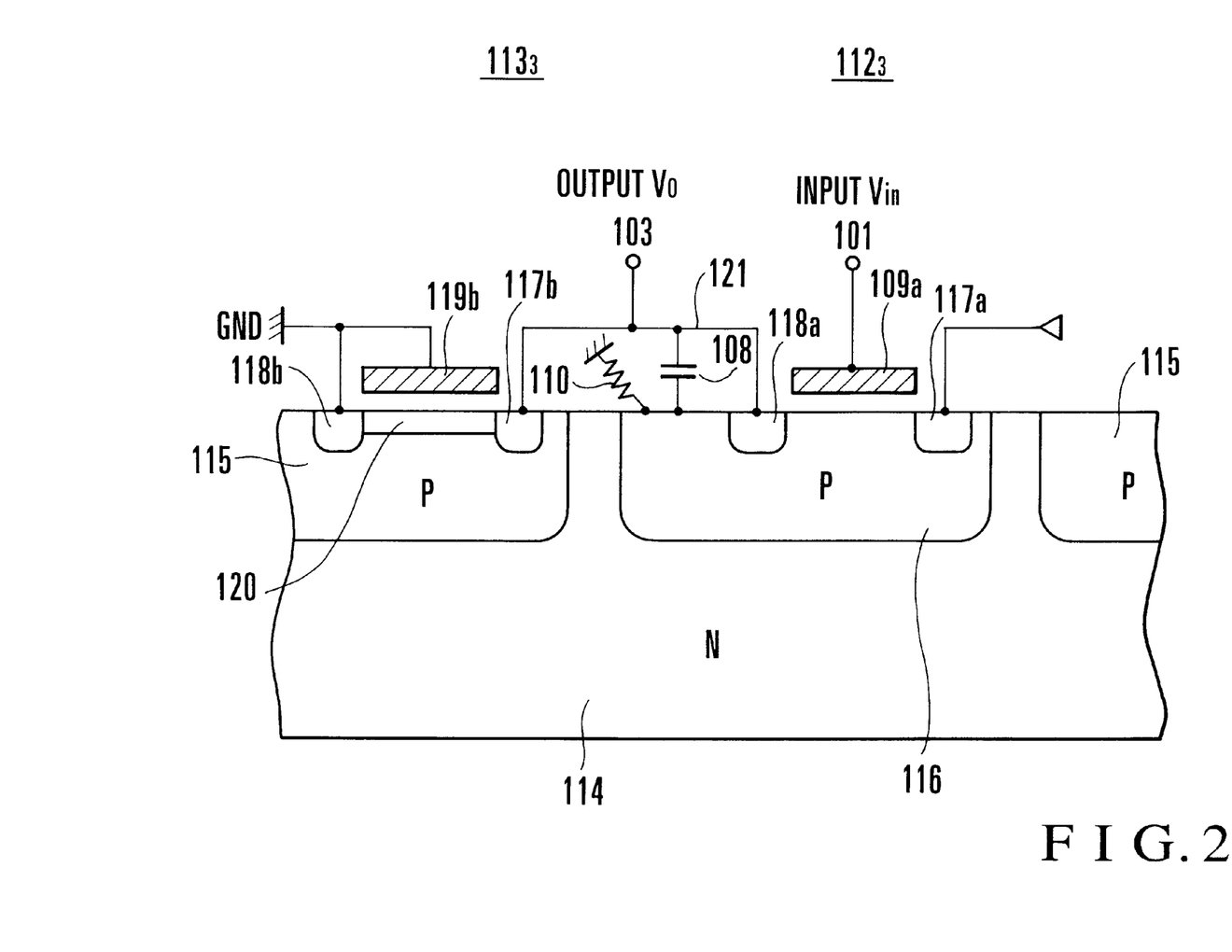
FIG. 2 is a longitudinal sectional view of the third stage of the source follower amplifier shown in FIG. 1.

FIG. 2 shows the third stage portion of the three-stage source follower amplifier shown in FIG. 1.

Referring to FIG. 2, a solid-state image sensing device is formed on a semiconductor substrate (n type) 114. The source follower amplifier shown in FIG. 1 constitutes the output circuit of this solid-state image sensing device.

The driver transistor $112_3$ constituting the third stage of the source follower amplifier is formed in the back gate, i.e., a first opposite conductivity-type conductive region (p type) 116 on the semiconductor substrate (n type) 114. The load transistor $113_3$ as a peripheral device constituting the third stage of the source follower amplifier is formed in a second opposite conductivity-type conductive region (p type) 115 on the semiconductor substrate 114. The opposite conductivity-type conductive regions 115 and 116 have a conductivity type opposite to that of the semiconductor substrate and isolated from each other by the semiconductor substrate 114. An interconnection 121 in contact with a source 118a is coupled to the opposite conductivity-type conductive region 116 through the capacitance 108 and also connected to a drain 117b of the load transistor $113_3$.

The first and third driver transistors $112_1$ and $112_3$ are surface-type transistors each having a channel in the p-type region 116, as shown in FIG. 2. The load transistors $113_1$ and $113_3$ are buried-type transistors each having an n-type region 120 at the upper portion of the p-type region 115 and a channel formed in the n-type region 120, as shown in FIG. 2. The surface- or buried-type transistors have the same structure except the gate length and the gate width to facilitate the process.

A gate insulating film is formed from a silicon oxide film or has a structure in which a silicon nitride film is sandwiched by silicon oxide films. The resistances of gate electrodes 119a and 119b consisting of polysilicon are lowered by diffusing an n-type impurity such as phosphorus so that the gate electrodes can be regarded as a conductive metal. The diffusion layers such as the sources 118a and 118b and the drains 117a and 117b are formed by doping an n-type impurity such as phosphorus.

For both the p-type regions and the n-type regions, ion implantation is performed on the order of several hundred keV and 1E12. The gate length and gate width of each transistor are determined such that the gain and bandwidth satisfy the design specifications.

Figure 3:
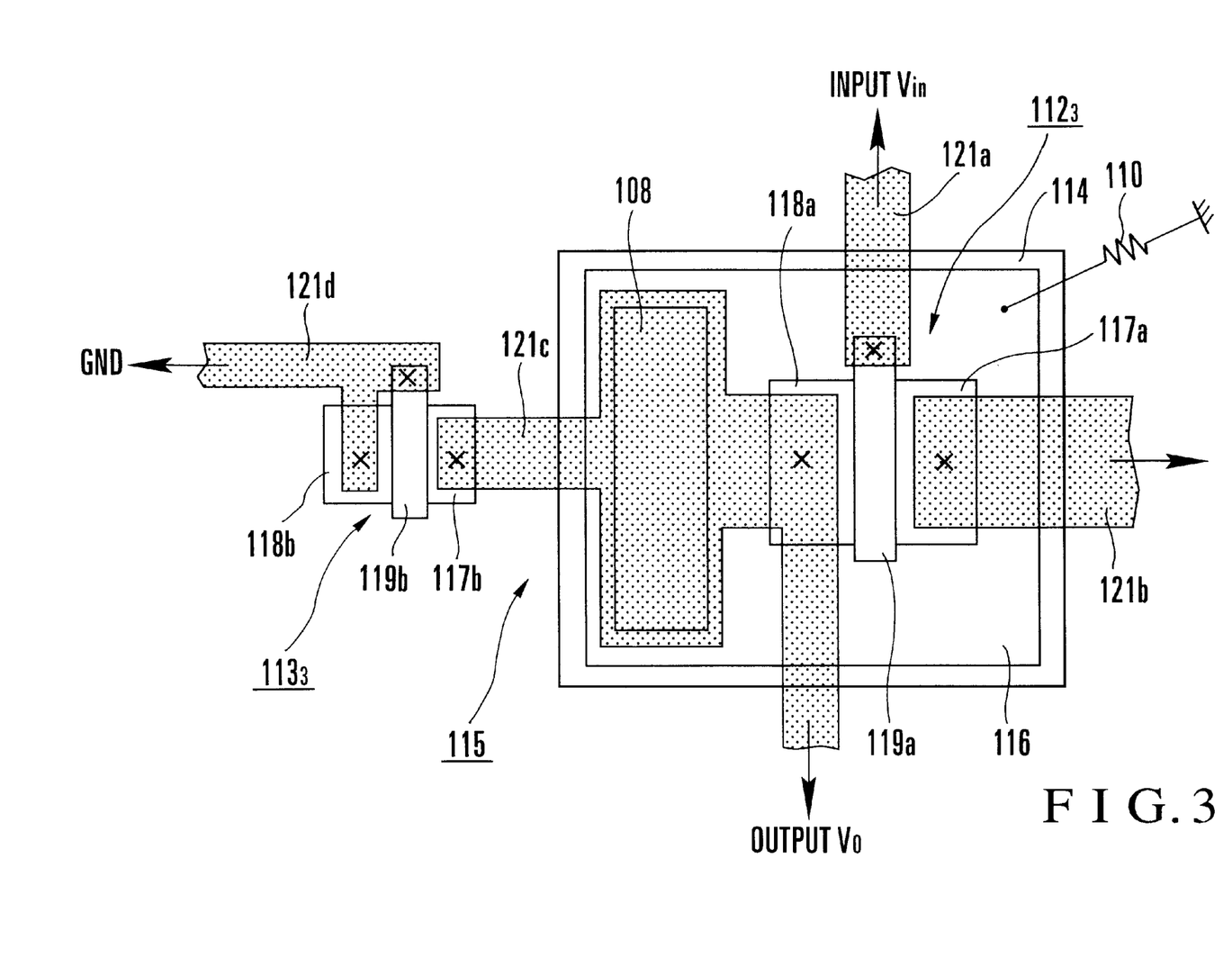
FIG. 3 is a plan view of the third stage of the source follower amplifier shown in FIG. 1.

FIG. 3 shows the third stage of the source follower amplifier shown in FIG. 1. In FIG. 3, the driver transistor $112_3$ is formed in the opposite conductivity-type conductive region (p type) 116 on the semiconductor substrate (n type) 114, as described above. The load transistor $113_1$ is formed in the opposite conductivity-type conductive region (p type) 115 on the semiconductor substrate 114.

The opposite conductivity-type conductive region 116 is surrounded by the semiconductor substrate 114 and insulated from the opposite conductivity-type conductive region 115. An interconnection 121c in contact (x represents a contact) with the source 118a is coupled to the opposite conductivity-type conductive region 116 through the capacitance 108 and also connected to the drain 117b of the load transistor $113_3$.

As described above, the gain of the source follower amplifier increases as the back gate conductance of the driver transistor $112_3$ becomes small, as is apparent from equation (1). The channel of the driver transistor $112_3$ of the source follower for which the opposite conductivity-type conductive region 116 of the driver transistor $112_3$ and the opposite conductivity-type conductive region 115 are common is coupled to the gate electrode 119a through the gate oxide film and to the opposite conductivity-type conductive region 116 through the depletion layer capacitance. For this reason, modulation of the channel potential due to the signal input from the gate electrode 119a is enhanced when the coupling (gm) between the gate electrode 119a and the channel is large or when coupling (gmb) between the opposite conductivity-conductive region 116 which is set at a predetermined potential independently of the signal and the channel is small. The channel of the source follower driver transistor is formed from the same conductor as that of the source 118a. When the opposite conductivity-type conductive region 116 of the driver transistor $112_3$ is isolated from the other opposite conductivity-type conductive region 115, and the source 118a and the opposite conductivity-type conductive region 116 are set at the same potential or applied with the same phase and amplitude, the back gate conductance can be nullified to increase the gain.

In the solid-state image sensing device, when the source 118a and the opposite conductivity-type conductive region 116 are set at the same potential, the semiconductor substrate 114 and the opposite conductivity-type conductive region 116 are sometimes forward-biased, as described above. In the present invention, however, the source 118a and the opposite conductivity-type conductive region 116 are coupled through the sufficiently large capacitance 108 and applied with the same phase and amplitude. In this arrangement, by inserting the high resistance 110, the DC potential of the opposite conductivity-type conductive region 116 can be set at a voltage not to forward-bias the opposite conductivity-type conductive region 116 and the semiconductor substrate 114.

According to this embodiment, the gain of the source follower amplifier is high, and the back gate and the semiconductor substrate are not forward-biased even when the semiconductor substrate voltage lowers to about 5 V. Therefore, this source follower amplifier can cope with a lower power supply voltage.

Figure 4:
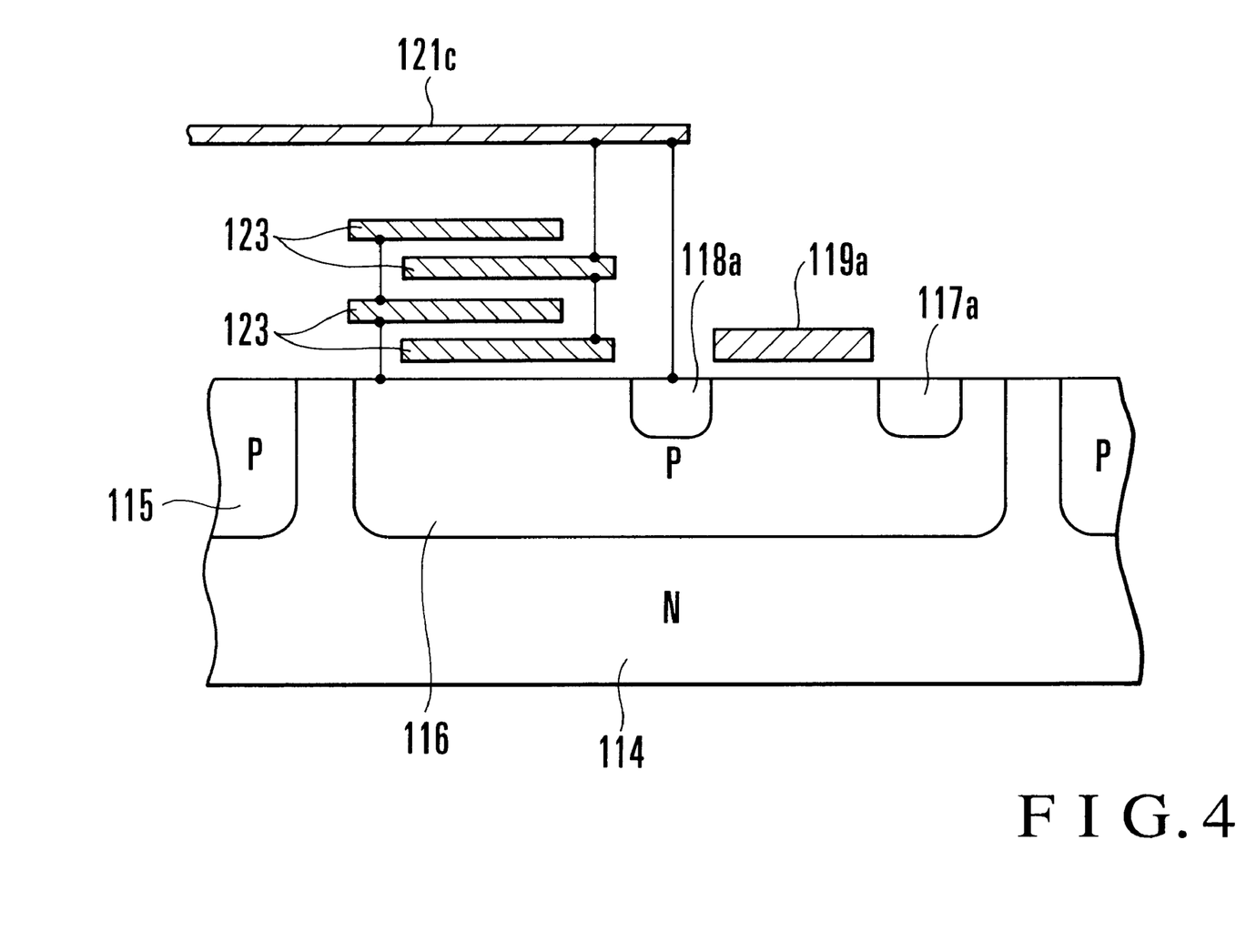
FIG. 4 is a longitudinal sectional view of the third stage of an on-chip three-stage source follower amplifier for a solid-state image sensing device according to the second embodiment of the present invention.

FIG. 4 shows the third driver transistor portion of an on-chip source follower amplifier for a solid-state image sensing device according to the second embodiment of the present invention.

The second embodiment is different from the first embodiment in that the coupling capacitance of an opposite conductivity-type conductive region (p type) 116 and a source 118a is formed by stacking a multiple of capacitor electrodes 123 of polysilicon at a predetermined interval, as shown in FIG. 4. The odd-numbered capacitor electrodes 123 counted from a semiconductor substrate 114 side are connected to an interconnection 121c, and the even-numbered capacitor electrodes 123 are connected to the second opposite conductivity-type conductive region 116. By staking n capacitor electrodes 123, the capacitance can be increased to about n times that of one capacitor electrode 123 without increasing the two-dimensional area.

To form two or three capacitor electrodes 123, the capacitor electrodes 123 can be formed simultaneously with formation of the electrodes of the solid-state image sensing device main body without increasing the number of masks because two or three polysilicon layers are used as the electrodes of the solid-state image sensing device main body.

According to this embodiment, the gain of the source follower amplifier is high, and the source follower amplifier can cope with a lower power supply voltage, as in the first embodiment. In addition, since the number of masks need not be increased in forming the capacitor electrodes, the manufacturing efficiency is improved.

Figure 5:
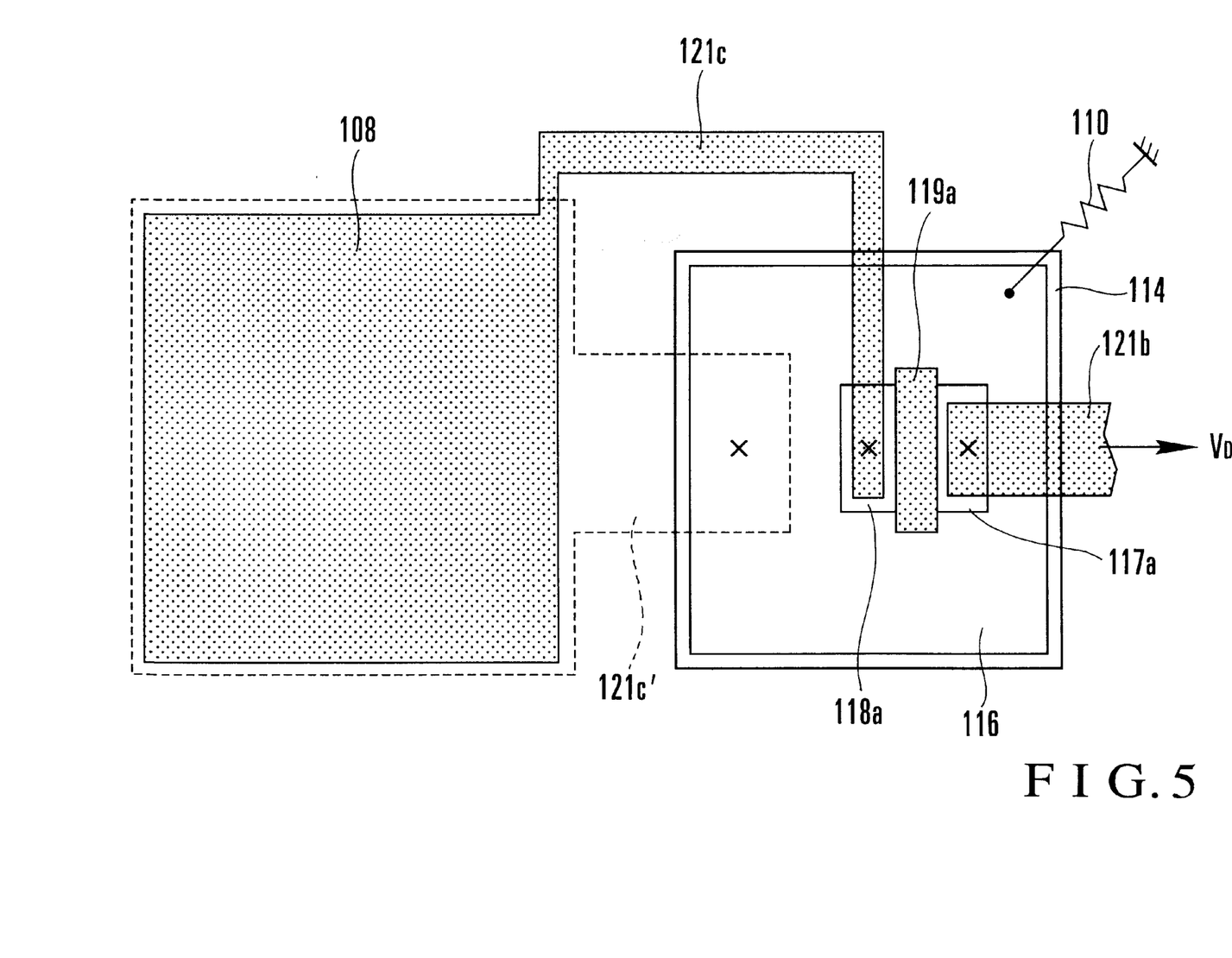
FIG. 5 is a plan view of the third stage of an on-chip three-stage source follower amplifier for a solid-state image sensing device according to the third embodiment of the present invention.

FIG. 5 shows the third driver transistor portion of an on-chip source follower amplifier according to the third embodiment of the present invention.

The third embodiment is different from the first embodiment in that a coupling capacitance 108 of a back gate, i.e., an opposite conductivity-type conductive region (p type) 116 and a source 118a is formed outside the opposite conductivity-type conductive region 116, as shown in FIG. 5. The reason why the coupling capacitance 108 is formed outside the opposite conductivity-type conductive region 116 is as follows. When the capacitance 108 is formed in the opposite conductivity-type conductive region 116, and the capacitance 108 is increased, a capacitance 109 shown in FIG. 1 also increases to decrease the effect of increasing the gain.

According to this embodiment, the source follower amplifier can cope with a lower power supply voltage, as in the first embodiment. In addition, since the capacitance 109 can be prevented from increasing, the gain of the source follower amplifier can be increased.

In the above-described embodiments, the arrangement of the present invention is applied to only the second and third source follower amplifiers of the three-stage source follower amplifier (amplification circuit). When the arrangement of the present invention is applied to the first source follower amplifier, and interconnection length increases. Although the amplification gain increases, the signal detection capacitance increases. However, the arrangement of the present invention can be applied to the first source follower amplifier in accordance with the increase/decrease relationship between the gain and the signal detection capacitance.

For a source follower amplifier having three or more stages as well, the arrangement of the present invention can be applied to all stages or second and subsequent stages. In addition, the types of the transistors constituting the source follower amplifier, i.e., the surface- and buried-type transistors can be applied to any arrangement independently of the types of the embodiments.

In the above embodiments, an n-channel transistor has been described. However, the arrangement of the present invention can also be applied to a p-channel transistor by changing the polarities.

A specific example of the present invention will be described next.

In the above embodiments, at a signal frequency of 16 MHz, when the value of the capacitance 104 or 108 between the source 118a and the opposite conductivity-type conductive region 116 was about 10 pF, i.e., about 10 times the value of the capacitance 105 or 109 between the opposite conductivity-type conductive region 116 and the semiconductor substrate 114, a satisfactory result was obtained. The value of the resistances 106 and 110 is preferably as high as about 1 MΩ.

Figure 6:
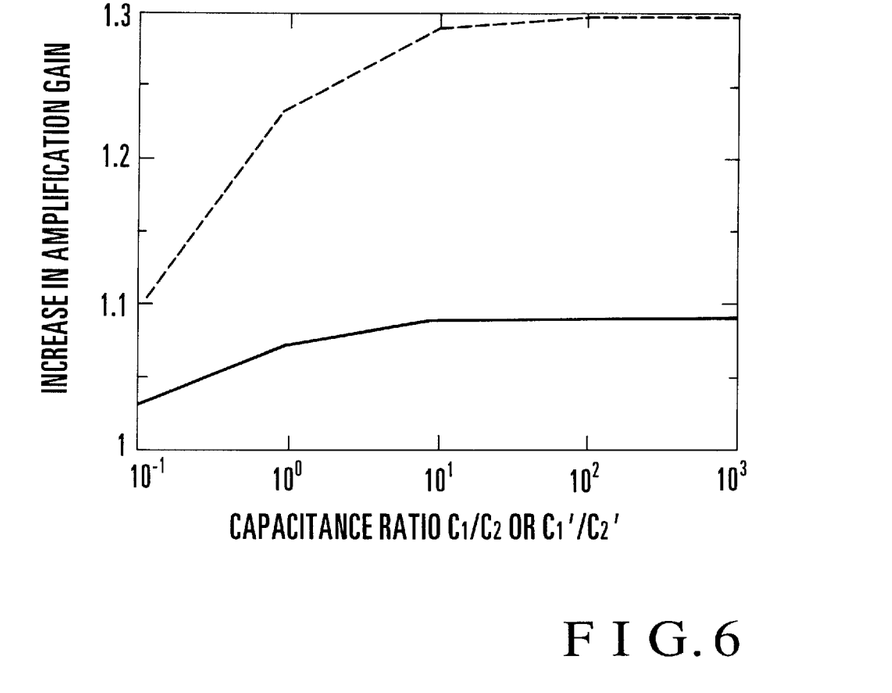
FIG. 6 is a graph showing the relationship between the capacitance ratio and the gain of the on-chip source follower amplifier in the present invention.

FIG. 6 shows the relationship between the ratio of the capacitance 104 or 108 between the source 118a and the opposite conductivity-type conductive region 116 and the capacitance 105 or 109 between the opposite conductivity-type conductive region 116 and the semiconductor substrate 114, i.e., C1/C2 or C1'/C2', and the gain increase of the first and third source follower amplifiers. As shown in FIG. 6, when the capacitance ratio is increased to about 10 times, the gain increases to about 1.07 times per stage. When the present invention is applied to n stages of a multistage source follower amplifier, the gain can increase to $1.07^n$ times that of the normal arrangement.

As has been described above, according to the present invention, a driver transistor and the formation region of the remaining portions are isolated, the driver source and the back gate as the driver transistor formation region are coupled through a capacitance, and a voltage is applied to the back gate through a high resistance. In this arrangement, the gain of the source follower amplifier is large, and even when the semiconductor substrate voltage is lowered, the back gate and the semiconductor substrate are not forward-biased. Therefore, a solid-state image sensing device having an on-chip source follower amplifier capable of coping with a low power supply voltage can be realized.

In addition, when the capacitance for coupling is formed simultaneously with the electrodes of the solid-state image sensing device main body by stacking electrodes of polysilicon, the efficiency of the manufacturing process can be improved.

Furthermore, when the capacitance for coupling is formed outside the opposite conductivity-type conductive region as the back gate, the gain of the source follower amplifier can more effectively increase than in an arrangement with the capacitance formed in the region.

What is claimed is:

1. An on-chip source follower amplifier having at least one amplification circuit formed on a semiconductor substrate of a first conductivity type, said amplification circuit comprising a driver transistor formed in a first conductive region of a second conductivity type on said semiconductor substrate, a peripheral device formed in a second conductive region of the second conductivity type on said semiconductor substrate, the second conductive region being isolated from the first conductive region, a first capacitance for coupling the first conductive region to a source of said driver transistor, and a high resistance connected between the first conductive region and a DC power supply.

2. An amplifier according to claim 1, wherein said on-chip source follower amplifier comprises a plurality of series-connected amplification circuits, and each of said amplification circuits comprises said driver transistor, said peripheral device, the capacitance, and the high resistance.

3. An amplifier according to claim 1, wherein said on-chip source follower amplifier comprises a plurality of series-connected amplification circuits, and each of said amplification circuits except a first amplification circuit comprises said driver transistor, said peripheral device, the capacitance, and the high resistance.

4. An amplifier according to claim 1, wherein the first capacitance has electrodes comprising polysilicon layers stacked at a predetermined interval.

5. An amplifier according to claim 1, wherein the first capacitance has electrodes comprising polysilicon layers, said electrodes being formed simultaneously with electrodes of another device formed on said semiconductor substrate.

6. An amplifier according to claim 1, wherein the first capacitance is formed in a region outside the second conductive region on said semiconductor substrate.

7. An amplifier according to claim 1, wherein said amplifier further comprises a second capacitance for coupling the first conductive region to said semiconductor substrate, and the first capacitance is set to be about 10 times the second capacitance.

8. An amplifier according to claim 1, wherein when a frequency of an input signal is 16 MHz, the high resistance is set to be about 1 MΩ.

9. An amplifier according to claim 1, wherein said on-chip source follower amplifier constitutes an output circuit of a solid-state image sensing device formed on said semiconductor substrate.

10. An on-chip source follower amplifier for a solid-state image sensing device, which has at least one stage having a driver transistor and a peripheral device formed on a semiconductor substrate of a first conductivity type, wherein said peripheral device is formed in a first conductive region of a second conductivity type formed in said semiconductor substrate, said driver transistor is formed in a second conductive region isolated from the first conductive region, the second conductive region is coupled to a source of said driver transistor through a capacitance, and the second conductive region is applied with a DC voltage through a high resistance.

* * * * *